(12) United States Patent
Marotta et al.

(10) Patent No.: US 6,628,142 B1
(45) Date of Patent: Sep. 30, 2003

(54) ENHANCED PROTECTION FOR INPUT BUFFERS OF LOW-VOLTAGE FLASH MEMORIES

(75) Inventors: Giulio-Giuseppe Marotta, Contigliano (IT); Elio D'Ambrosio, Avezzano (IT)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 09/651,478

(22) Filed: Aug. 30, 2000

(51) Int. Cl.⁷ ............................................. H03K 19/175
(52) U.S. Cl. ........................................... 326/83; 326/81
(58) Field of Search ............................. 326/80, 81, 83, 326/86

(56) References Cited

U.S. PATENT DOCUMENTS

| | | | | |
|---|---|---|---|---|
| 5,300,835 A | * | 4/1994 | Assar et al. | 326/83 |
| 5,589,790 A | * | 12/1996 | Allen | 326/80 |
| 5,852,540 A | * | 12/1998 | Haider | 326/81 |
| 5,973,900 A | | 10/1999 | Sher | |
| 5,999,390 A | | 12/1999 | Cho et al. | |
| 6,002,627 A | * | 12/1999 | Chevallier | 365/212 |
| 6,013,932 A | | 1/2000 | Chevallier | 257/392 |
| 6,031,393 A | * | 2/2000 | Wayner | 326/81 |
| 6,084,430 A | * | 7/2000 | Wayner | 326/80 |

FOREIGN PATENT DOCUMENTS

JP          59224162          4/1985

OTHER PUBLICATIONS

"1.8 V 0.15 V (Normal Range), and 1.2–1.95 V (Wide Range Power Supply Voltage and Interface Standard for Non–Terminated Digital Integrated Circuit", *EIA/JEDEC Standard*, EIA/JESD8–7, Electronic Industries Association, Engineering Department, pp. 1–3, (1997).

"Test Method A114–A, Electrostatic Discharge (ESD) Sensitivity Testing Human Body Model (HBM)", *EIA/JEDEC STANDARD*, EIA/JESD22–A114–A, Electronic Industries Association, Engineering Department, pp. 1–9, (1997).

"Test Method A115–A, Electrostatic Discharge (ESD) Sensitivity Testing Machine Model (MM", *EIA/JEDEC STANDARD*, EIA/JESD22–A115–A, Electronics Industries Association, Engineering Department, pp. 1–9, (1997).

"Test Method C101, Field–Induced Charged–Device Model Test Method for Electrostatic Discharge Withstand Thresholds of Microelectronic Components", *JEDEC STANDARD*, JESD22–C101, Electronic Industries Association, Engineering Department, pp. 1–6, 1995.

\* cited by examiner

*Primary Examiner*—Don Phu Le
(74) *Attorney, Agent, or Firm*—Schwegman, Lundberg, Woessner & Kluth, P.A.

(57) ABSTRACT

An input buffer is discussed that inhibits semiconductor breakdown of thin gate-oxide transistors in low-voltage integrated circuits. One aspect of the input buffer includes an input stage having a gate, a drain, and a source. The gate of the input stage is receptive to an inhibiting signal, and the drain is receptive to an input signal. The input stage inhibits the input signal from being presented at the source of the input stage when the inhibiting signal is at a predetermined level. The input buffer further includes an output stage having an inverter that includes a first connection and a second connection. The first connection couples to the source of the input stage, and the second connection presents the input signal to a low-voltage flash memory device.

43 Claims, 4 Drawing Sheets

ENHANCED PROTECTION FOR INPUT BUFFERS OF LOW-VOLTAGE FLASH MEMORIES

TECHNICAL FIELD

The present invention relates generally to semiconductor integrated circuits. More particularly, it pertains to devices and methods to protect input buffers low-voltage flash memory devices.

BACKGROUND

A transistor is a device that controls the flow of electrons. This ability to control the flow is important in that information, in the form of electricity, may be processed or stored by the transistor. To process or store greater amounts of information, transistors can be collected together to form an integrated circuit. An example of an integrated circuit that processes information is a central processing unit (CPU), which can be likened to the computing aspect of the human brain. Another example of an integrated circuit, which can be likened to the memorizing aspect of the human brain, is a memory device for storing information. A computer comprises these two core integrated circuits—CPU and memory.

Memory devices have progressed from early designs, which consumed considerable power because of the need to continuously refresh the memory, to present devices, which are more desirable because of their frugal use of power. Presently, memory devices include low-voltage transistors. These low-voltage transistors use a voltage supply that is about 1.8 volts. Supplying too great a voltage to these low-voltage transistors, either by accident or design, would detrimentally affect the lifetime of these transistors.

Yet, voltage supplies larger than 1.8 volts exist in memory devices that include low-voltage transistors. Memory devices need these voltage supplies by design to perform memory operations, such as reading, programming, or erasing. In the event that a low-voltage transistor receives by accident an electrostatic discharge, voltages on the order of several thousand volts may undesirably enter and ruin the transistor. Such a lack of resistance by low-voltage transistors to higher voltages may lead to an eventual lack of acceptance in the marketplace for products based on memory devices that include such low-voltage transistors.

Thus, what is needed are devices and methods to inhibit the semiconductor breakdown that affects the lifetime of low-voltage transistors.

SUMMARY OF THE INVENTION

The above mentioned problems with low-voltage transistors and other problems are addressed by the present invention and will be understood by reading and studying the following specification. Devices and methods are described which accord these benefits.

In one illustrative embodiment, a system is discussed to enhance buffering low-voltage flash memory. The system includes a multiple of thin gate-oxide transistors and an input buffer. The input buffer is receptive to an enabling signal, an input signal, and an inhibiting signal. The input buffer further includes a component that inhibits semiconductor and/or oxide breakdown of the plurality of thin gate-oxide transistors when the inhibiting signal is at a low voltage level.

In another illustrative embodiment, an input buffer for a low-voltage flash memory device is discussed. The input buffer includes an input stage and an output stage. The input buffer optionally includes a voltage sensor and an inhibiting circuit. The input stage has a transistor that includes a gate, a drain, and a source. The gate is receptive to an inhibiting signal. The drain is receptive to an input signal. The transistor inhibits the input signal from being presented at the source when the inhibiting signal is at a first predetermined level. The output stage has an inverter that includes first and second connections. The first connection is coupled to the source of the transistor. The second connection presents the input signal to the low-voltage flash memory device. The voltage sensor triggers when the input signal is at a second predetermined level. The voltage sensor is receptive to a pumped signal and the input signal. The inhibiting circuit selectively produces the inhibiting signal. The inhibiting circuit is receptive to a pumped signal and a sensed signal.

Another illustrative embodiment includes a method for buffering a low-voltage flash memory device. The method includes transferring and outputting. The act of transferring is executed by an input stage having a gate, a drain, and a source. The gate of the input stage is receptive to an inhibiting signal. The drain of the input stage is receptive to an input signal. The input stage inhibits the input signal from being presented at the source when the inhibiting signal is at a predetermined level. The act of outputting is executed by an output stage by inverting by an inverter. The inverter includes a first connection and a second connection. The first connection is coupled to the source of the input stage. The second connection presents the input signal to the low-voltage flash memory device.

These and other embodiments, aspects, advantages, and features of the present invention will be set forth in part in the description which follows, and in part will become apparent to those skilled in the art by reference to the following description of the invention and referenced drawings or by practice of the invention. The aspects, advantages, and features of the invention are realized and attained by means of the instrumentalities, procedures, and combinations particularly pointed out in the appended claims.

DETAILED DESCRIPTION

Figure 1:
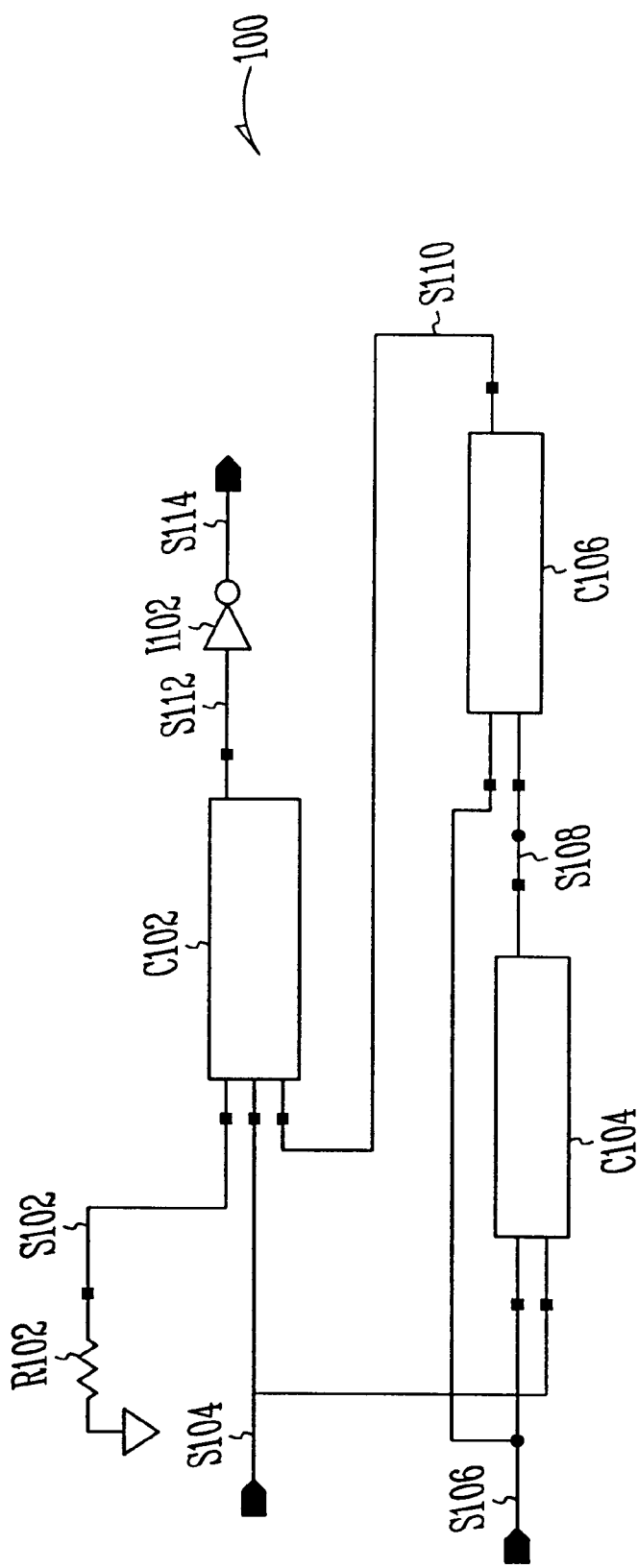
FIG. 1 is a block diagram of a system according to an embodiment of the present invention.

In the following detailed description of the invention, reference is made to the accompanying drawings which form a part hereof, and in which is shown, by way of illustration, specific embodiments in which the invention may be practiced. In the drawings, like numerals describe substantially similar components throughout the several views. These embodiments are described in sufficient detail to enable those skilled in the art to practice the invention. Other embodiments may be utilized and structural, logical, and electrical changes may be made without departing from the scope of the present invention.

The transistors described herein include transistors from bipolar-junction technology (BJT), field-effect technology (FET), or complementary metal-oxide-semiconductor (CMOS) technology. A metal-oxide-semiconductor (MOS) transistor includes a gate, a first node (drain), and a second node (source). Since a MOS is typically a symmetrical device, the true designation of "source" and "drain" is only possible once voltage is impressed on the terminals. The designations of source and drain herein should be interpreted, therefore, in the broadest sense.

The terms "high" and "low" as used herein refer to Vcc, the voltage supply, and ground, respectively. The term "external supply" as used herein refers to Vcc, the voltage supply. In one embodiment, the voltage supply supplies a voltage in the range of 1.65 to 2.22 volts, unless otherwise indicated.

The term "energy-storing device" described herein includes any devices capable of storing charges. The term "energy-storing device" includes a capacitor. The capacitor described herein can be any capacitor fabricated on an integrated circuit using any fabrication technique. The energy-storing device described herein, however, may be fabricated as either an n-channel transistor or a p-channel transistor; the transistor's source and drain are connected together to form one conductive plate, its gate forms the other conductive plate, and the oxide layer forms the dielectric.

The term "pre-charging device" described herein includes any devices capable of providing charges to maintain a predetermined level of charges in an energy-storing device while a system that includes the energy-storing device is turned off. The reason for pre-charging is thus: the energy-storing device may have to store a large amount of charges to enable a charge pump circuit to provide a high-voltage signal. Without pre-charging, an undesired amount of time may have to be taken once the system is turned on to charge the energy-storing device. The pre-charging device described herein can be a square-law device. The pre-charging device described herein can be any transistor fabricated on an integrated circuit using any fabrication technique. The pre-charging device described herein, however, may be fabricated as an n-channel transistor with its drain and gate connected together, the drain is connected to an external supply.

The term "charging device" described herein includes any devices capable of charging an energy-storing device up to the level of the external supply. The purpose of the charging device is to charge the energy-storing device to compensate for any level degradation that may occur from the pre-charged process. The charging device described herein can be any transistor fabricated on an integrated circuit using any fabrication technique. The charging device described herein, however, may be fabricated as an n-channel transistor. This transistor may be configured with its drain connected to an external supply.

The term "metal option" described herein includes a conductor that can be inserted to close a circuit or removed to open a circuit. Such a conductor may be inserted or removed at any appropriate time, such as after prototype fabrication, so as to obtain a desired circuit behavior.

The embodiments of the present invention focus on the problem of inhibiting semiconductor breakdown of low-voltage transistors that have thin gate-oxides. The term "semiconductor breakdown" means the inclusion of oxide breakdown. Digital circuits, such as flash memory, favor metal-oxide-semiconductor field-effect transistors (MOSFET) because of the digital nature of these transistors. MOSFETs are either on or off to symbolize the digits 0 or 1 depending on the voltage that is presented at the gate. Such a voltage helps to create an electric field that controls the digital state of a MOSFET.

One component of the MOSFET that is essential for creating the electric field is the gate-oxide. The gate-oxide acts like a dielectric to create a barrier between electrical charges with opposite polarity so as to maintain the electric field. As with most dielectrics, the gate-oxide has a certain dielectric strength. If the strength of the electric field created by the voltage at the gate is greater than the dielectric strength, the gate-oxide will breakdown, and the lifetime of the transistor is compromised.

The marketplace prefers handheld products that are based on low-voltage integrated circuits, such as flash memory, because such products use less power and therefore last longer. Handheld products need to store information, and low-voltage flash memory is chosen as a storage medium. Low-voltage flash memory uses a voltage supply of about 1.8 volts. To obtain the same speed as previous generations of transistors, which use a voltage supply of about 3.3 volts, the low-voltage flash memory includes transistors having gate-oxides of about 40 angstroms in thickness. Such a width is thinner than the width of gate-oxides of previous generations of transistors and is therefore more susceptible to high voltages.

Low-voltage flash memory that includes thin gate-oxide transistors also uses other transistors with varying requirements in voltage supplies: medium voltage, high voltage, and super high voltage. Flash memory needs these varying voltage supplies in order to operate the memory cells, such as in reading, programming, and erasing. In one aspect of the invention, a certain high voltage may be applied to the flash memory in order to transition the flash memory to a test mode. As discussed above, the thinner gate-oxide presents a problem for transitioning the flash memory to a desired test mode.

Another problem is the presence of electrostatic discharge. Electrostatic discharge is a transfer of electrostatic charge between bodies at different electrostatic potentials that is caused by direct contact or induced by an electrostatic field. Electrostatic discharge may transfer a voltage on the order of several thousands of volts to a low-voltage transistor having a thin gate-oxide. If such a voltage is presented to the thin gate-oxide, the transistor having such a gate-oxide may be ruined.

The embodiments of the present invention solve these and other problems. The embodiments of the present invention are now discussed below.

FIG. 1 is a block diagram of a system according to an embodiment of the present invention. System 100 includes an input buffer C102. In one embodiment, the system 100 enhances the buffering of low-voltage flash memory. The input buffer C102 acts to inhibit semiconductor breakdown of transistors having thin gate-oxides. Such an inhibition occurs when certain voltages are presented to the input buffer C102. In one embodiment, these certain voltages include voltages having an undesired high voltage level. The input buffer C102 is receptive to an enabling signal S102, an input signal S104, and an inhibiting signal S110.

The enabling signal S102 is connected to ground via a resistor R102. In one embodiment, the resistor R102 is about $2.4 \times 10^3$ ohms. The input signal S104 is a signal presented at an input pin of an integrated circuit that embodies the system 100. Other circuits, which will be described hereinafter, generate the inhibiting signal S110. The inhibiting signal S110 helps the input buffer C102 to inhibit undesired voltages from entering the system 100 to ruin transistors having thin gate-oxides. In one embodiment, such inhibiting occurs when the inhibiting signal S110 is at a low voltage level.

The input buffer C102 presents the input signal S104 as signal S112. The signal S112 enters an inverter I102. The inverter I102 presents an inverted signal S112, called signal S114, to other circuits following the system 100. In one embodiment, such other circuits include circuitry of a flash memory device.

The system 100 includes a voltage sensor C104. The voltage sensor C104 is receptive to the input signal S104 and a pumped signal S106. A charge-pump circuit (not shown) generates the pumped signal S106. In one embodiment, the pumped signal S106 includes a voltage of about 5 volts.

The voltage sensor C104 monitors the input signal S104. When the input signal S104 reaches a desired high voltage level, the voltage sensor C104 triggers. The triggering of the voltage sensor C104 produces sensed signal S108 at a certain voltage level; otherwise the sensed signal S108 is produced at another voltage level. The sensed signal S108 reflects whether the voltage sensor C104 has been triggered. The sensed signal S108 is presented to an inhibiting circuit C106.

The inhibiting circuit C106 selectively produces the inhibiting signal SI110. The inhibiting circuit C106 is receptive to the sensed signal S108 and the pumped signal S106. When the sensed signal S108 reflects that the voltage sensor C106 has been triggered, the inhibiting circuit C106 produces the inhibiting signal S110 at a level that causes the input buffer C102 to inhibit the transfer of the input signal S104. Such an inhibition prevents the input signal from entering the system 100.

Figure 2:
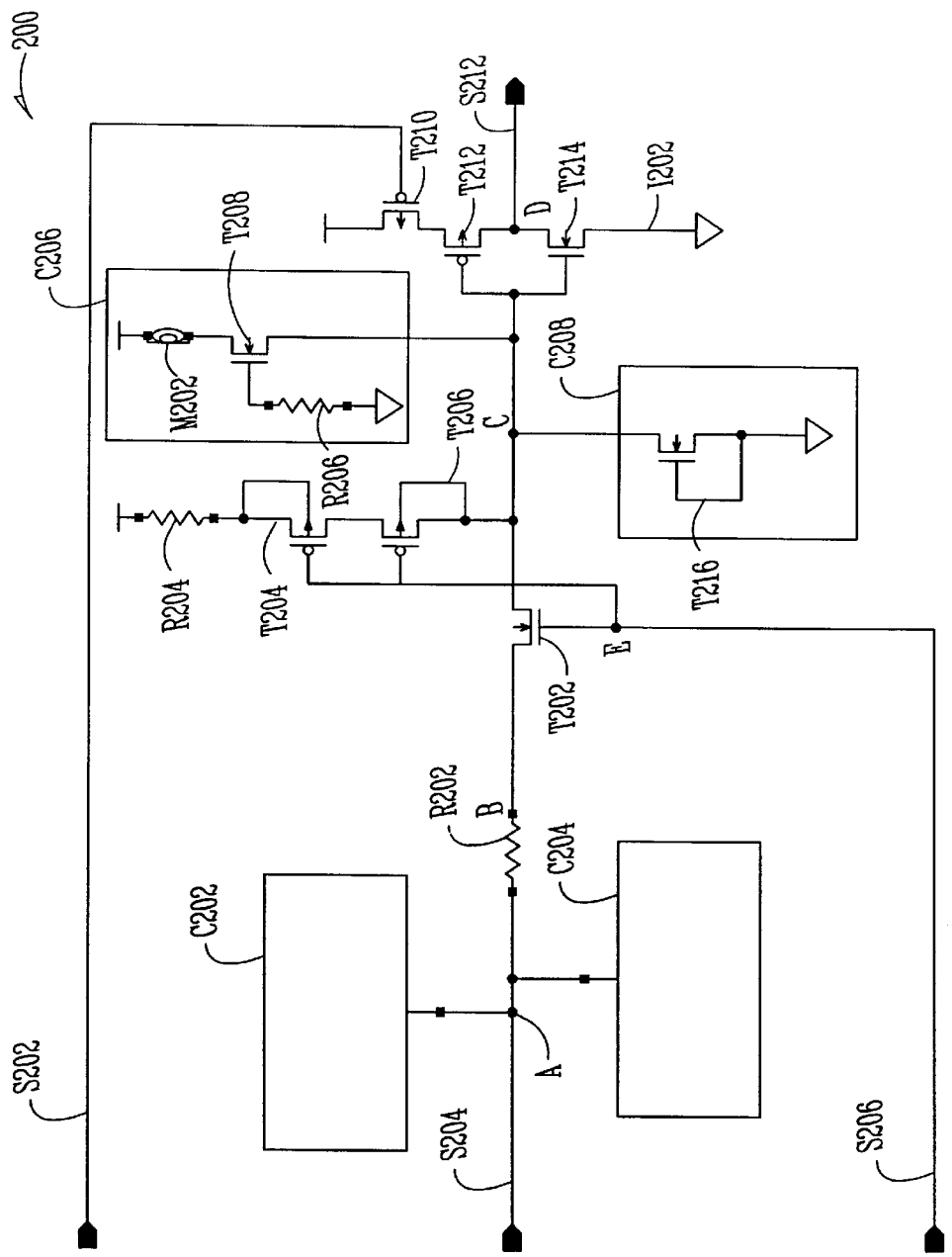
FIG. 2 is a circuit diagram according to an embodiment of the present invention.

FIG. 2 is a circuit diagram according to an embodiment of the present invention. The input buffer 200 represents an implementation of the input buffer C102 as discussed in FIG. 1 above. The input buffer 200 is receptive to an input signal S204; this input signal S204 is similar to the input signal S104 as discussed hereinbefore. The input signal S204 is presented to node A.

A first clamping circuit C202 couples to the node A. The first clamping circuit C202 clamps the input S204 to the voltage supply, which is about 1.8 volts. A second clamping circuit C202 also couples to the node A. A second clamping circuit C204 clamps the input signal S204 to ground. These two clamping circuits, C202 and C204, help to overcome an electrostatic-discharge test that is applied to an integrated circuit, such as a low-voltage memory device that includes the input buffer 200. In one embodiment, the electrostatic-discharge test is a test that complies with EIA/JEDEC standards. These standards include EIA/JEDEC, Test Method A114-A: Electrostatic Discharge (ESD) Sensitivity Testing Human Body Model (HBM) (October 1997) and EIA/JEDEC, Test Method A115-A: Electrostatic Discharge (ESD) Sensitivity Testing Machine Model (MM) (October 1997).

A resistor R202 couples to the node A. The resistor R202 acts to limit current that accompanies the input signal S204 having a high voltage, such as when the input signal S204 is from an electrostatic discharge. In one embodiment, the resistor R202 is about $1.106 \times 10^3$ ohms. The resistor R202 also couples to a node B. The input signal S204 having passed through the resistor R202 from node A is presented at node B.

The input buffer 200 includes an input stage T202 having first, second, and third connections. In one embodiment, the first connection can be considered the gate, the second connection considered the source, and the third connection considered the drain. Thus, the input stage T202 can be considered a transistor having a gate, source, and drain. In one embodiment, the input stage T202-is an n-channel transistor.

The source of the input stage T202 couples to node B and therefore is receptive to the input signal S204 that is presented at node B. The drain of the input stage T202 presents the signal S204 at node C depending on the voltage level of the inhibiting signal S206 presented at node E. Thus, the input buffer 200 is receptive to the inhibiting signal S206; this inhibiting signal S206 is similar to the inhibiting signal S106 as discussed hereinbefore. The gate of the input stage T202 couples to node E.

In the embodiment in which the input stage T202 is an n-channel transistor, the input stage T202 transfers the input signal S204 from the source at node B to the drain at node C. This occurs when the inhibiting signal S206 presents a high voltage at node E. In the same embodiment, the input stage T202 inhibits the input signal S204 from the source at node B to be transferred to the drain at node C. This occurs when the inhibiting signal S206 presents a low voltage at node E.

This behavior of the input stage T202 enables it to inhibit undesired voltages from entering an integrated circuit, such as a flash memory device, to ruin low-voltage transistors having thin gate-oxides. Such an inhibition occurs in at least two circumstances. First, when an integrated circuit is inactive, the inhibiting signal S206 presents a low voltage level at the gate and thereby the input stage T202 inhibits the input signal S204 at the source from being transferred to the drain. Suppose that during handling of a flash memory device, an electrostatic discharge accidentally occurs. Because the flash memory device is inactive, the input stage T202 inhibits the electrostatic discharge from entering the flash memory device.

Second, when an integrated circuit is active, the inhibiting signal S206 may present a low voltage level at the gate and thereby the input stage T202 inhibits the input signal S204 at the source from being transferred to the drain. Suppose that during operation of the flash memory device, a large voltage is presented by design via input signal S204 to transition the integrated circuit into a test mode. Other circuitry, which will be discussed hereinafter, brings the inhibiting signal S206 to a low voltage level and thereby inhibits the signal S204 from entering the integrated circuit, such as a flash memory device.

What has been shown hereinbefore is that the input stage T202 operates to selectively inhibit a voltage from entering an integrated circuit whether the integrated circuit is active or inactive. As discussed, such a behavior is useful to resist certain voltages that may ruin low-voltage transistors having thin gate-oxides.

The input buffer 200 includes a transistor T206 having a gate, a drain, a source, and a bias. In one embodiment, the transistor T206 includes a p-channel transistor. The term "bias" means the inclusion of a substrate bias that is used to inhibit undesired body effects. The gate of the transistor T206 couples to the node E and is therefore receptive to the inhibiting signal S206. The drain and the bias of the transistor T206 couple to the node C.

The input buffer 200 includes a transistor T204 having a gate, a drain, a source, and a bias. In one embodiment, the transistor T204 includes a p-channel transistor. The gate of the transistor T204 couples to the node E and is also therefore receptive to the inhibiting signal S206. The drain of the transistor T204 couples to a resistor R204. In one embodiment, the resistor R204 is about $0.203 \times 10^3$ ohms. The drain of the transistor T204 couples to the drain of the transistor T206. The bias of the transistor T204 couples to the source of the transistor T204. The resistor R204 couples to a voltage supply.

The purpose of the transistors T204 and T206 is to prevent the node C from floating. These two transistors are turned on when the inhibiting signal S206 is at a low voltage signal. Node C will be at a high voltage level when these two transistors are turned on thereby preventing the node C from floating.

A third clamping circuit C206 couples to the node C. The third clamping circuit C206 includes an n-channel transistor T208 having a gate, a drain, and a source. The gate of the n-channel transistor T208 couples to a resistor R206. In one embodiment, the resistor R206 is about $0.249 \times 10^3$ ohms. The resistor R206 couples to ground. The drain of the n-channel transistor T208 couples to a metal option M202. The metal option M202 couples to the voltage supply. In one embodiment, the metal option M202 can be removed so as to inactivate the third clamping circuit C206. The source of the n-channel transistor T208 couples to the node C.

A fourth clamping circuit C208 also couples to the node C. The fourth clamping circuit C208 includes an n-channel transistor T216 having a gate, a drain, and a source. The gate of the n-channel transistor T216 couples to the source, the drain couples to the node C, and the source couples to ground.

These two clamping circuits, C206 and C208, help to enhance a charge-device-model test that is applied to an integrated circuit, such as a low-voltage memory device that includes the input buffer 200. In one embodiment, the charge-device-model test is a test that complies with EIA/JEDEC standards. One of these standards includes EIA/JEDEC, Test Method C101: Field-Induced Charged-Device Model Test Method for Electrostatic Discharge Withstand Thresholds of Microelectronic Components (May 1995).

The input buffer 200 includes an output stage I202 having a first connection and a second connection. The first connection couples to node C and the second connection couples to node D. The first connection receives the input signal S204 presented at node C and the second connection presents an inverted signal S204 as signal S212. The signal S212 progresses to other circuitry (not shown) of the integrated circuit, such as a low-voltage flash memory device.

In one embodiment, the output stage I202 is an inverter I202 having the first connection and the second connection as discussed hereinbefore. The inverter I202 includes an n-channel transistor T214 having a gate, a drain, and a source. The gate of the n-channel transistor T214 couples to the node C, the drain couples to the node D, and the source couples to ground.

The inverter I202 further includes a p-channel transistor T212 having a gate, a drain, and a source. The gate of the p-channel transistor T212 couples to the node C. The drain of the p-channel transistor T212 couples to the node D. Therefore, the gate of the n-channel transistor T214 and the gate of the p-channel transistor T212 define the first connection. The drain of the n-channel transistor T214 and the drain of the p-channel transistor T212 define the second connection.

The input buffer includes an enabling transistor T210. The enabling transistor T210 is a p-channel transistor having a gate, a drain, and a source. The gate of the enabling transistor T210 couples to an enabling signal S202. In one embodiment, the enabling signal S202 is low. Therefore, the enabling transistor T210 is turned on. The source of the enabling transistor T210 couples to the voltage supply. The drain of the enabling transistor T210 couples to the drain of the p-channel transistor T212 of the inverter I202.

The enabling transistor, being turned on, keeps the inverter I202 active because current can flow from the voltage supply to the drain of the enabling transistor T210 and to the inverter I202. The inverter I202 produces the signal S212 at a low level at node D when the input signal S204 is at a high level at the node C. This is the result because the n-channel transistor T214 is turned on while the p-channel transistor T212 is turned off when the input signal S204 is at a high level. The p-channel transistor T212, being turned off, disconnects the node D to the voltage supply. Instead the node D connects to ground via the n-channel transistor T214, which is turned on. Ground defines a logic low level, and hence the signal S212 is at a low level.

When the input signal S204 is at a low level, the opposite happens. The n-channel transistor T214 is turned off, and the p-channel transistor T212 is turned on. The p-channel transistor T212, being turned on, connects the node D to the voltage supply. The voltage supply defines a logic high level, and hence the signal S212 is at a high level.

Figure 3:
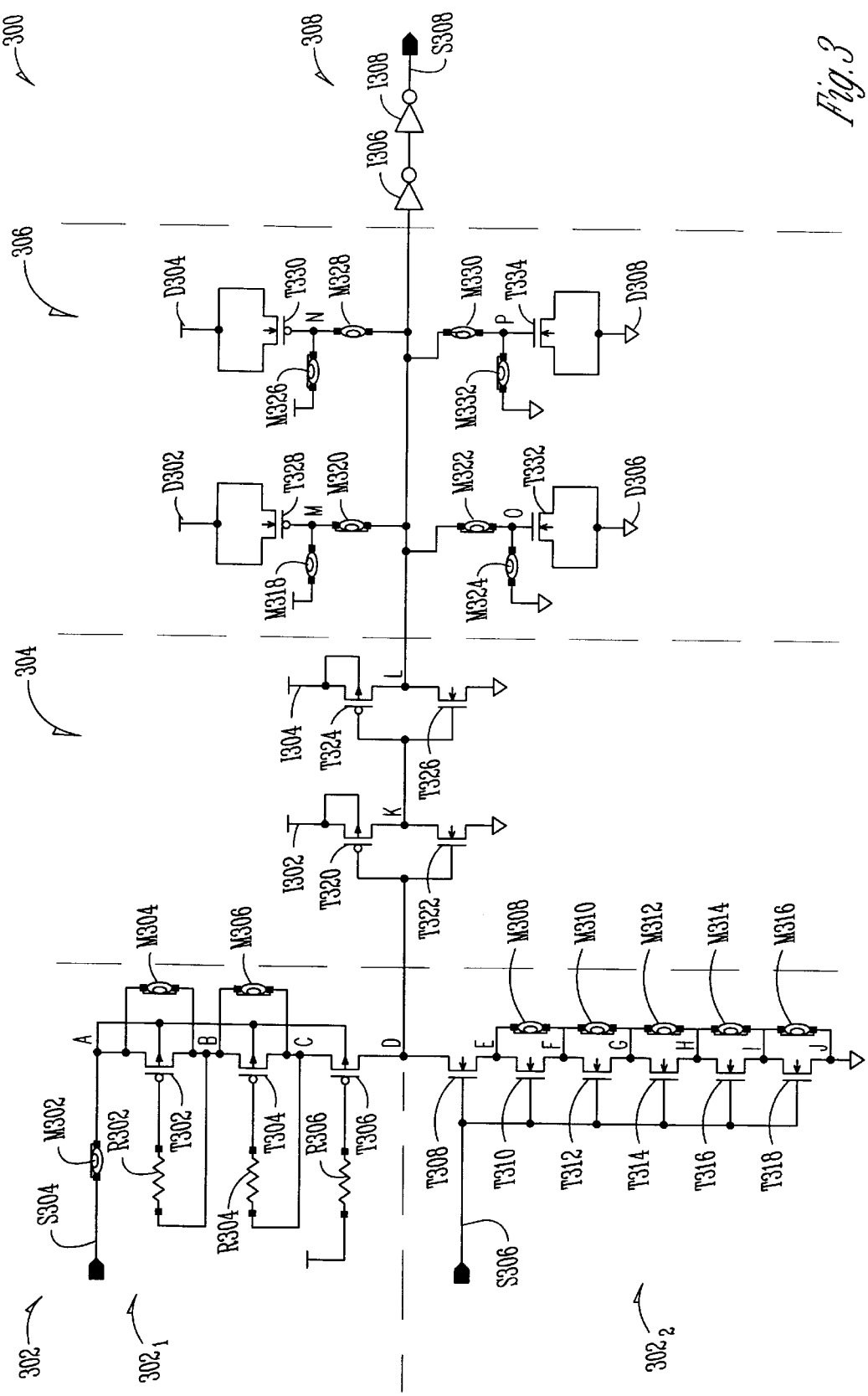
FIG. 3 is a circuit diagram according to an embodiment of the present invention.

FIG. 3 is a circuit diagram according to an embodiment of the present invention. A voltage sensor 300 includes a multiple of stages: a triggering stage 302, a first inverting stage 304, a delay stage 306, and a second inverting stage 308. Depending on the voltage level of the input signal S304, the voltage sensor 300 may trigger. The input signal S304 is similar to the input signal S104 as discussed hereinbefore. A sensed signal S308, which is produced by the voltage sensor 300, reflects whether the voltage sensor 300 was triggered.

The triggering stage 302 includes a first portion $302_1$. The first portion $302_1$ is receptive to the input signal S304. The input signal S304 passes through a metal option M302. The metal option M302 may be removed to inactivate the voltage sensor 300. The input signal S304, having passed through the metal option M302, is presented at node A.

The first portion $302_1$ includes a p-channel transistor T302 having a gate, a drain, a source, and a bias. The gate of the p-channel transistor T302 couples to a resistor R302. In one embodiment, the resistor R302 is about $1.024 \times 10^3$ ohms. The source of the p-channel transistor T302 couples to the node A and is receptive to the input signal S304. The drain of the p-channel transistor T302 couples to the resistor R302 and a node B. The bias of the of the p-channel transistor T302 couples to the node A. A metal option M304 couples to the drain and the source of the p-channel transistor T302. Current will flow through the metal option M304 instead of through the transistor T302 when the metal option M304 is inserted. This is the case because current seeks a path that has the least resistance.

The first portion $302_1$ includes a p-channel transistor T304 having a gate, a drain, a source, and a bias. The gate of the p-channel transistor T304 couples to the resistor R304. In one embodiment, the resistor R304 is about $1.024 \times 10^3$ ohms. The source of the p-channel transistor T304 couples to the node B. The drain of the p-channel transistor T304 couples to the resistor R304 and a node C. The bias couples to the node A. A metal option M306 couples to the drain and the source of the p-channel transistor T304. Current will flow through the metal option M306 instead of through the transistor T304 when the metal option M304 is inserted.

The first portion 302₁ includes a p-channel transistor T306 having a gate, a drain, a source, and a bias. The gate of the p-channel transistor T306 couples to a resistor R306. In one embodiment, the resistor R306 is about $1.024 \times 10^3$ ohms. The resistor R306 couples to the voltage supply. The source of the p-channel transistor T306 couples to the node C, the drain couples to the node D, and the bias couples to node A.

The p-channel transistor T306 is generally turned off because its gate couples through the resistor to the voltage supply, which is a logic high level. To turn on the p-channel transistor T306, the voltage at node C must be greater than the sum of the threshold voltage ($V_{TR}$) of the p-channel transistor T306 and the voltage presented at the gate of the p-channel transistor T306 (Vcc). Thus, a voltage at node C that turns on the p-channel transistor T306 is defined as the triggering voltage. This triggering voltage can be considered as the voltage that triggers the voltage sensor 300.

The voltage at node C is derived from the voltage at node A. The voltage at node A is derived from the input signal S304. Thus, the input signal S304 can provide the triggering voltage if the input signal S304 is sufficiently high, such as the sum of Vcc and $V_{TR}$. The triggering voltage can be increased by an additional $V_{TR}$ if the metal option M306 is removed. When the metal option M306 is removed, the current must flow through the p-channel transistor T304. A voltage drop across the source and the drain is created by the flow of current across the p-channel transistor T304. This voltage is about one $V_{TR}$. The triggering voltage can be further increased to an additional $V_{TR}$ by removing the metal option M304. Thus, the metal options M304 and M306, together, can increase the triggering voltage to the sum of Vcc and three $V_{TR}$'S.

The triggering stage 302 includes a second portion 302₂. The second portion 302₂ is receptive to a pumped signal S306. The pumped signal S306 is similar to the pumped signal S106 as discussed hereinbefore. The pumped signal S306 is presented to an n-channel transistor T308 having a gate, a drain, and a source. The gate of the n-channel transistor T308 is receptive to the pumped signal S306, the drain couples to the node C, and the source couples to the node E.

The second portion 302₂ includes a number of n-channel transistors: T310, T312, T314, T316, and T318. Each of these n-channel transistors includes a gate, a drain, and a source. The gate of the n-channel transistor T310 is receptive to the signal S306, the drain couples to the node E, and the source couples to node F. A metal option M308 couples to the drain and the source of the n-channel T310. The gate of the n-channel transistor T312 is receptive to the signal S306, the drain couples to the node F, and the source couples to node G. A metal option M310 couples to the drain and the source of the n-channel T312. The gate of the n-channel transistor T314 is receptive to the signal S306, the drain couples to the node G, the source couples to node H. A metal option M312 couples to the drain and the source of the n-channel T314. The gate of the n-channel transistor T316 is receptive to the signal S306, the drain couples to the node H, and the source couples to node I. A metal option M316 couples to the drain and the source of the n-channel T318. The gate of the n-channel transistor T318 is receptive to the signal S306, the drain couples to the node I, and the source couples to node J. A metal option M316 couples to the drain and the source of the n-channel T318.

Each of the metal options, M308 to M316, can be removed to decrease the tripping voltage by 50 millivolts, or can be inserted to increase the tripping voltage by the same amount, which is 50 millivolts. A logic high signal is presented to the node D to progress through subsequent stages 304 to 308 if the input signal S304 is sufficiently high to trigger the trigger stage 302. Otherwise, a logic low signal is presented to the node D.

The voltage sensor 300 includes the first inverting stage 304. The first inverting stage 304 includes a first inverter I302 and a second inverter I304. The first inverter I302 includes an n-channel transistor T322, having a gate, a drain, and a source, and a p-channel transistor T320, having a gate, a drain, a source, and a bias. The gate of the n-channel transistor T322 couples to the node D, the drain couples to a node K, and the source couples to ground. The gate of the p-channel transistor T320 couples to the node D, the source couples to the voltage supply, the drain couples to the node K, and the bias couples to the voltage supply. The second inverter I304 includes an n-channel transistor T326, having a gate, a drain, and a source, and a p-channel transistor T324, having a gate, a drain, a source, and a bias. The gate of the n-channel transistor T326 couples to the node K, the drain couples to the node L, and the source couples to ground. The gate of the p-channel transistor T324 couples to the node K, the source couples to the voltage supply, the drain couples to the node L, and the bias couples to the voltage supply.

The inverter I302 of the first inverting stage 304 will invert the logic signal, which is presented at node D. The logic signal will be inverted again by the inverter I304 of the first inverting stage 304. Thus, the logic signal, which is presented at node D, will be presented in the same logic level at node L.

The voltage sensor 300 includes the delay stage 306 having a number of energy-storing devices: D302, D304, D306, and D308. Each of the energy-storing devices, D302 to D308, is fabricated as a transistor having a gate, a drain, and a source. The energy-storing device D302 includes a p-channel transistor T328 that couples its gate to a node M and its drain and source to the voltage supply. A metal option M318 couples to the node M as well as to the voltage supply. Another metal option M320 couples to the node M and the node L. The energy-storing device D304 includes a p-channel transistor T330 that couples its gate to a node N and its drain and source to the voltage supply. A metal option M326 couples to the node N as well as to the voltage supply. Another metal option M328 couples to the node N and the node L. The energy-storing device D306 includes an n-channel transistor T332 that couples its gate to a node O and its drain and source to ground. A metal option M324 couples to the node O as well as to ground. Another metal option M322 couples to the node O and to the node L. The energy-storing device D308 includes an n-channel transistor T334 that couples its gate to a node P and its drain and source to ground. A metal option M322 couples to the node P as well as to ground. Another metal option M330 couples to the node P and the node L.

The logic signal, which is presented at node L, will be delayed by the delay stage 306. The delay stage 306 serves to reject undesired noise i4 the logic signal. The duration of the delay is dependent on the number of active energy-storing devices D302 to D308. The metal options M320, M328, M322, and M330 can be removed, to inactivate, or be inserted, to activate, the energy-storing devices D302, D304, D306, and D308, respectively. The metal options M318, M326, M324, and M330 can be removed to float the node M, N, O, and P, respectively. The metal options M318, M326, M324, and M330 can be inserted to bring the node M, N, O, and P high so as to allow a shorter delay for noise rejection.

The voltage sensor 300 includes a second inverting stage 308. The second inverting stage 308 includes an inverter I306 and the inverter I308. The inverter I308 presents a sensed signal S308. After being delayed by the delay stage 306, the logic signal is inverted by the inverter I306 and inverted again by the inverter I308. Hence, the logic signal, which is presented at node L, is at the same logic level after it passes through inverter I308. The logic signal, having passed through inverter I308, is also known as a sensed signal S308. The sensed signal S308 is similar to the sensed signal S108, which is discussed hereinbefore. The sensed signal is at a high logic level when the voltage sensor 300 is triggered. Otherwise, the sensed signal is at a low logic level.

Figure 4:
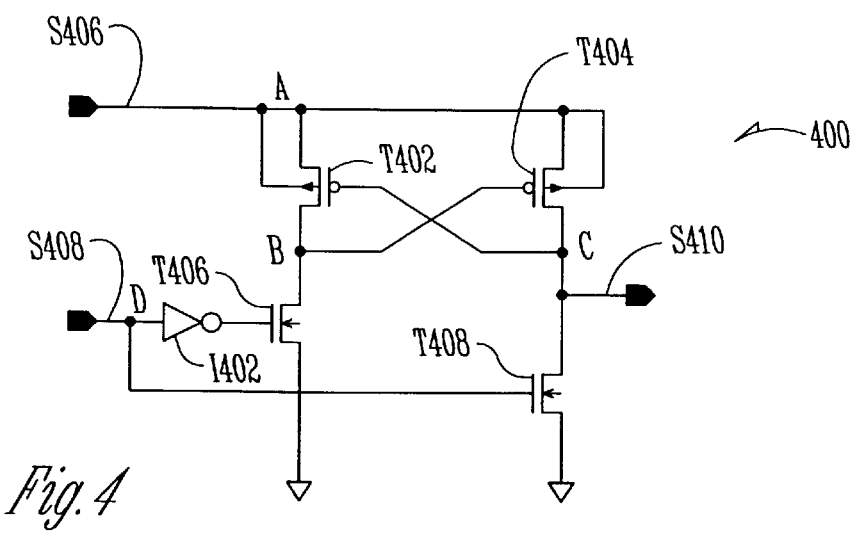
FIG. 4 is a circuit diagram according to an embodiment of the present invention.

FIG. 4 is a circuit diagram according to an embodiment of the present invention. An inhibiting circuit 400 selectively produces an inhibiting signal S410. The inhibiting signal S410 is similar to the inhibiting-signal S110 as discussed hereinbefore. The inhibiting circuit 400 is receptive to a sensed signal S408. The sensed signal S408 is presented to a node D.

An inverter I402 couples to the node D to receive the sensed signal S408. The inverter I402 inverts the sensed signal S408 and presents the sensed signal S408, which is now inverted, to an n-channel transistor T406. The n-channel transistor T406 includes a gate, a drain, and a source. The gate of the n-channel transistor T406 receives the sensed signal S408, which is inverted, the drain couples to the node B, and the source couples to ground.

The n-channel transistor T406 is turned on when the inverted sensed signal is at a high logic level. Thus, the sensed signal S408, prior to the inversion, is at a low logic level. The sensed signal S408, at a low logic level, reflects that the voltage sensor circuit (not shown), which precedes the inhibiting circuit 400, did not trigger.

The p-channel transistor T404 is also turned on when the n-channel transistor T406 is turned on. The p-channel transistor T404 includes a gate, a drain, a source, and a bias. The gate of the p-channel transistor T404 couples to the node B, the source couples to the node A, the drain couples to the node C, and the bias couples to the node A. The node A presents a pumped signal S406. The pumped signal S406 is similar to the pumped signal S106, which is discussed hereinbefore. The reason the p-channel transistor T404 is turned on is because the n-channel transistor, when turned on, pulls the gate of the p-channel transistor T404 at node B to ground, which is a low logic signal. The node C is also pulled high to the level of the pumped signal S406 via the source and drain of the p-channel transistor T404. Because the node C presents the inhibiting signal, when the node C is at a high logic level, the inhibiting signal is at a high logic level.

Returning to node D, the inhibiting circuit includes an n-channel transistor T408 having a gate, a drain, and a source. The gate of the n-channel transistor T408 couples to the node D, the drain couples to the node C, and the source couples to ground. When the node D presents the sensed signal S408 at a low logic level, the n-channel transistor T406 is turned on as discussed hereinbefore, but the n-channel transistor T408 is turned off.

When the node D presents the sensed signal S408 at a high logic level, the n-channel transistor T408 is turned on, but the n-channel transistor T406 is now turned off. The node C is pulled low by the n-channel transistor T408. The p-channel transistor T404 is turned off because the node C presents a low logic level to the p-channel transistor T402, which turns on the p-channel transistor T402. The p-channel transistor T402 includes a gate, a drain, a source, and a bias. The gate of the p-channel transistor T402 couples to the node C, the source couples to the node A, the drain couples to the node B, and the bias couples to the node A. The source and drain of the p-channel transistor T402 pull node B high to the level of the pumped signal S406 when the p-channel transistor T402 is turned on. When node B is at a high logic level, transistor T404 is turned off.

What has been shown is that the inhibiting signal S410 depends on the sensed signal S406. The inhibiting signal S410 is at the voltage level of the pumped signal S406, which is about 5 volts, when the sensed signal S408 is at a low logic level. The inhibiting signal S410 is at a low logic level when the sensed signal S408 is at a high logic level. The sensed signal S408 is at a high logic level when the voltage sensor (not shown) is triggered.

One use of the inhibiting signal S410 at a low logic level includes support for a special manufacturing mode. The inhibiting signal S410, at a low logic level, can be used to inhibit high voltages from affecting thin gate-oxide transistors residing beyond the input buffer. However, at the same time, such high voltages can be input into the integrated circuit housing the input buffer so that the special manufacturing mode is supported.

Figure 5:
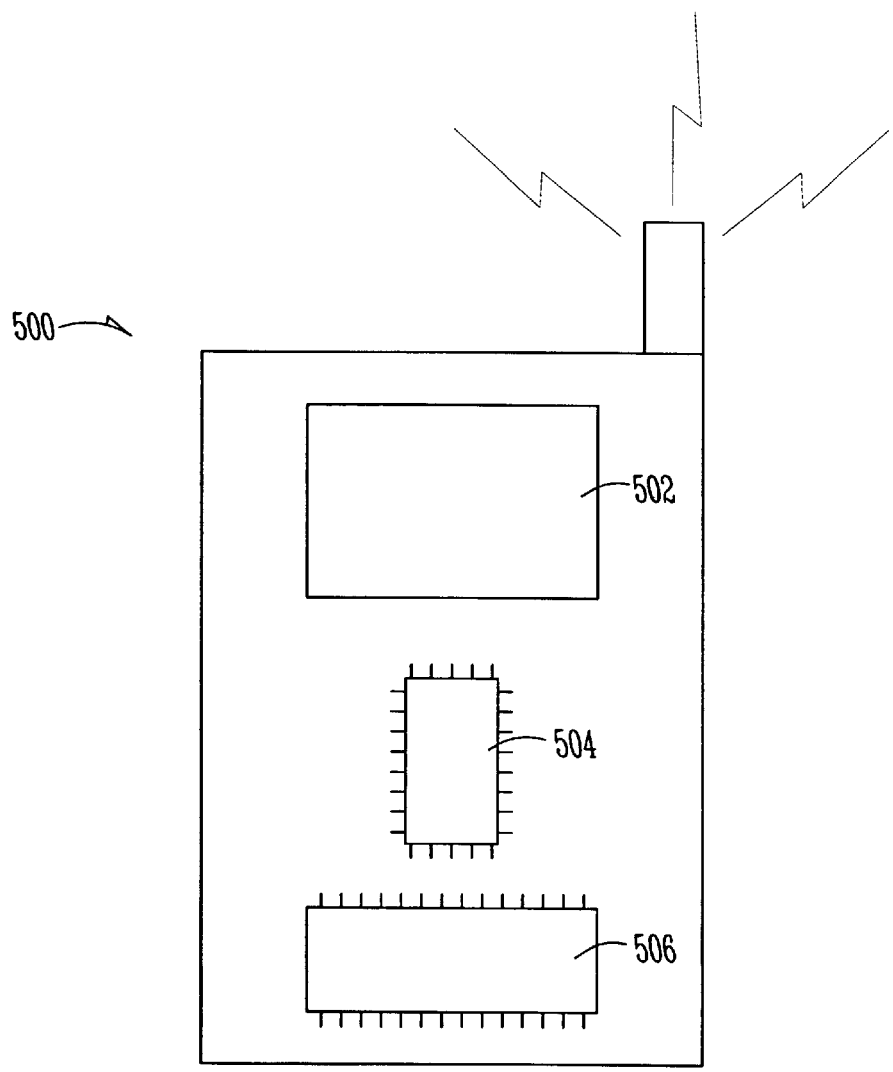
FIG. 5 is a block diagram according to an embodiment of the present invention.

FIG. 5 is a block diagram according to one embodiment of the present invention. A wireless device 500 includes a display 502, a processor 504, and a low-voltage flash memory device 506. The display 502 provides a user interface that can be navigated by a user to control the wireless device 500. The processor 504 processes data and control provided by the user or a remote server (not shown). The low-voltage flash memory device 506 provides storage to store data and controls. In one embodiment, the low-voltage flash memory device 506 includes a multiple of thin gate-oxide transistors, and an input buffer as discussed hereinbefore. The wireless device 500 is selected from a group consisting of a cellular phone, a personal appliance, and an Internet appliance.

Conclusion

Systems, devices, and methods have been discussed to inhibit semiconductor breakdown of thin gate-oxide transistors. These thin gate-oxide transistors may be used in 32-megabit integrated circuits, such as flash memory. Previous generations of integrated circuits use a power supply in the range of 2.7 to 5 volts. The embodiments of the present invention focus on integrated circuits that use a power supply in the range of 1.65 volts to 2.22 volts. To guarantee the same timing behavior as previous generations of integrated circuits, low-voltage integrated circuits use thin gate-oxide transistors, such as CMOS. A possibility exists that a voltage greater than 2.22 volts may be introduced to these thin gate-oxide transistors. When such a voltage is present, the lifetime of these transistors may be compromised.

The embodiments of the present invention inhibit semiconductor breakdown of the thin gate-oxide transistors in the presence of voltages greater than 2.22 volts so that the lifetime is not compromised.

Although the specific embodiments have been illustrated and described herein, it will be appreciated by those of ordinary skill in the art that any arrangement which is calculated to achieve the same purpose may be substituted for the specific embodiment shown. This application is intended to cover any adaptations or variations of the present invention. It is to be understood that the above description is intended to be illustrative, and not restrictive. Combinations of the above embodiments and other embodiments will be apparent to those of skill in the art upon reviewing the above description. The scope of the invention includes any other applications in which the above structures and fabrication methods are used. Accordingly, the scope of the invention should only be determined with reference to the appended claims, along with the full scope of equivalents to which such claims are entitled.

We claim:

1. A system to enhance buffering low-voltage flash memory, comprising:
   a multiple of thin gate-oxide transistors; and
   an input buffer receptive to an enabling signal, an input signal, and an inhibiting signal, wherein the input buffer includes a component that inhibits semiconductor breakdown of the multiple of thin gate-oxide transistors when the inhibiting signal is at a low voltage level.

2. The system of claim 1, wherein the component includes a first connection, a second connection, and a third connection, wherein the first connection is coupled to the inhibiting signal, wherein the second connection is coupled to the input signal, wherein the third connection presents the input signal when the inhibiting signal is at a first predetermined level.

3. The system of claim 2, wherein the third connection of the component refrains from presenting the input signal when the inhibiting signal is at a second predetermined level so as to inhibit semiconductor breakdown of the multiple of thin gate-oxide transistors when the input signal is at an undesired high voltage level.

4. The system of claim 1, further comprising a voltage sensor receptive to the input signal and a pumped signal, wherein the voltage sensor produces a sensed signal at a third predetermined level when the input signal is at a desired high voltage level, otherwise the voltage sensor produces the sensed signal at a fourth predetermined level.

5. The system of claim 4, further comprising an inhibiting circuit receptive to the pumped signal and the sensed signal, wherein the inhibiting circuit produces the inhibiting signal.

6. A wireless device, comprising:
   a processor;
   a display; and
   a low-voltage flash memory device that includes:
      a multiple of thin gate-oxide transistors; and
      an input buffer receptive to an enabling signal, an input signal, and an inhibiting signal, wherein the input buffer includes a component that inhibits semiconductor breakdown of the multiple of thin gate-oxide transistors when the inhibiting signal is at a predetermined level.

7. The wireless device of claim 6 wherein the component comprises an n-channel transistor comprising a gate receptive to the inhibiting signal and a drain receptive to the input signal wherein the n-channel transistor inhibits the input signal from being presented at a source of the n-channel transistor when the inhibiting signal is at the predetermined level.

8. An input buffer for a low-voltage flash memory device, comprising:
   an input stage having a first connection, a second connection, and a third connection, wherein the first connection is receptive to an inhibiting signal, wherein the second connection is receptive to an input signal, wherein the input stage inhibits the input signal from being presented at the third connection when the inhibiting signal is at a predetermined level;
   an output stage having a first connection and a second connection, wherein the first connection is coupled to the third connection of the input stage, and wherein the second connection presents the input signal to the low-voltage flash memory device;
   a resistor coupled to the second connection of the input stage, wherein the resistor limits a current when the input signal comprises a signal generated from an electrostatic discharge; and
   a first clamping circuit coupled to the resistor to clamp the input signal to a voltage supply, wherein the first clamping circuit enhances an electrostatic-discharge test that is applied to the low-voltage memory device.

9. The input buffer of claim 8 wherein:
   the input stage comprises an n-channel transistor;
   the first connection of the input stage comprises a gate of the n-channel transistor;
   the second connection of the input stage comprises a source of the n-channel transistor;
   the third connection of the input stage comprises a drain of the n-channel transistor;
   the output stage comprises an inverter comprising a p-channel transistor coupled in series with an n-channel transistor;
   the first connection of the output stage comprises a gate of the p-channel transistor in the inverter coupled to a gate of the n-channel transistor in the inverter;
   the second connection of the output stage comprises a drain of the n-channel transistor in the inverter coupled to a drain of the p-channel transistor in the inverter; and
   further comprising:
      an enabling transistor coupled between the voltage supply and the inverter;
      a pair of p-channel transistors coupled in series between the voltage supply and the third connection of the input stage, gates of each of the pair of p-channel transistors being receptive to the inhibiting signal;
      a second clamping circuit coupled to the resistor to clamp the input signal to ground;
      a third clamping circuit coupled to the third connection of the input stage to clamp the input signal being presented at the third connection of the input stage to the voltage supply; and
      a fourth clamping circuit coupled to the third connection of the input stage to clamp the input signal being presented at the third connection of the input stage to ground.

10. An input buffer for a low-voltage flash memory device, comprising:
   an input stage having a first connection, a second connection, and a third connection, wherein the first connection is receptive to an inhibiting signal, wherein the second connection is receptive to an input signal, wherein the input stage inhibits the input signal from being presented at the third connection when the inhibiting signal is at a predetermined level;
   an output stage having a first connection and a second connection, wherein the first connection is coupled to the third connection of the input stage, and wherein the second connection presents the input signal to the low-voltage flash memory device;

a resistor coupled to the second connection of the input stage, wherein the resistor limits a current when the input signal comprises a signal generated from an electrostatic discharge; and a first clamping circuit coupled to the third connection of the input stage to clamp the input signal being presented at the third connection of the input stage to a voltage supply, wherein the first clamping circuit enhances a charge-device-model test that is applied to the low-voltage memory device.

11. The input buffer of claim 10 wherein:

the input stage comprises an n-channel transistor;

the first connection of the input stage comprises a gate of the n-channel transistor;

the second connection of the input stage comprises a source of the n-channel transistor;

the third connection of the input stage comprises a drain of the n-channel transistor;

the output stage comprises an inverter comprising a p-channel transistor coupled in series with an n-channel transistor;

the first connection of the output stage comprises a gate of the p-channel transistor in the inverter coupled to a gate of the n-channel transistor in the inverter;

the second connection of the output stage comprises a drain of the n-channel transistor in the inverter coupled to a drain of the p-channel transistor in the inverter; and further comprising:

an enabling transistor coupled between the voltage supply and the inverter;

a pair of p-channel transistors coupled in series between the voltage supply and the third connection of the input stage, gates of each of the pair of p-channel transistors being receptive to the inhibiting signal;

a second clamping circuit coupled to the resistor to clamp the input signal to the voltage supply;

a third clamping circuit coupled to the resistor to clamp the input signal to ground; and a fourth clamping circuit coupled to the third connection of the input stage to clamp the input signal being presented at the third connection of the input stage to ground.

12. An input buffer for a low-voltage flash memory device, comprising:

an input stage having a first connection, a second connection, and a third connection, wherein the first connection is receptive to an inhibiting signal, wherein the second connection is receptive to an input signal, wherein the input stage inhibits the input signal from being presented at the third connection when the inhibiting signal is at a predetermined level;

an output stage having a first connection and a second connection, wherein the first connection is coupled to the third connection of the input stage, and wherein the second connection presents the input signal to the low-voltage flash memory device;

a resistor coupled to the second connection of the input stage, wherein the resistor limits a current when the input signal comprises a signal generated from an electrostatic discharge; and a first clamping circuit coupled to the resistor to clamp the input signal to ground, wherein the first clamping circuit enhances an electrostatic-discharge test that is applied to the low-voltage memory device.

13. The input buffer of claim 12 wherein:

the input stage comprises an n-channel transistor;

the first connection of the input stage comprises a gate of the n-channel transistor;

the second connection of the input stage comprises a source of the n-channel transistor;

the third connection of the input stage comprises a drain of the n-channel transistor;

the output stage comprises an inverter comprising a p-channel transistor coupled in series with an n-channel transistor;

the first connection of the output stage comprises a gate of the p-channel transistor in the inverter coupled to a gate of the n-channel transistor in the inverter;

the second connection of the output stage comprises a drain of the n-channel transistor in the inverter coupled to a drain of the p-channel transistor in the inverter; and further comprising:

an enabling transistor coupled between a voltage supply and the inverter;

a pair of p-channel transistors coupled in series between the voltage supply and the third connection of the input stage, gates of each of the pair of p-channel transistors being receptive to the inhibiting signal;

a second clamping circuit coupled to the resistor to clamp the input signal to the voltage supply;

a third clamping circuit coupled to the third connection of the input stage to clamp the input signal being presented at the third connection of the input stage to the voltage supply; and a fourth clamping circuit coupled to the third connection of the input stage to clamp the input signal being presented at the third connection of the input stage to ground.

14. An input buffer for a low-voltage flash memory device, comprising:

an input stage having a gate, a drain, and a source, wherein the gate is receptive to an inhibiting signal wherein the drain is receptive to an input signal, wherein the input stage inhibits the input signal from being presented at the source when the inhibiting signal is at a predetermined level;

an output stage having a first connection and a second connection, wherein the first connection is coupled to the source of the input stage, and wherein the second connection presents the input signal to the low-voltage flash memory device; and a first p-channel transistor having a gate, a drain, a source, and a bias, wherein the gate is receptive to the inhibiting signal, wherein the source is coupled to the source of the input stage, and wherein the bias is coupled to the source of the first p-channel transistor.

15. The input buffer of claim 14, further comprising a second p-channel transistor having a gate, a drain, a source, and a bias, wherein the gate is receptive to the inhibiting signal, wherein the source is coupled to the drain of the first p-channel transistor, wherein the bias is coupled to the drain of the second p-channel transistor.

16. The input buffer of claim 15, further comprising a resistor having a first connection and a second connection, wherein the first connection is coupled to the drain of the second p-channel transistor, wherein the second connection is coupled to a voltage supply.

17. The input buffer of claim 16, wherein the coupling between the source of the first p-channel transistor and the drain of the input stage defines a node, wherein the first p-channel transistor and the second p-channel transistor act to prevent the node from floating when the inhibiting signal is at the predetermined level.

18. The input buffer of claim 14 wherein:

the input stage comprises an n-channel transistor;

the output stage comprises an inverter comprising a p-channel transistor coupled in series with an n-channel transistor;

the first connection of the output stage comprises a gate of the p-channel transistor in the inverter coupled to a gate of the n-channel transistor in the inverter;

the second connection of the output stage comprises a drain of the n-channel transistor in the inverter coupled to a drain of the p-channel transistor in the inverter; and further comprising:

an enabling transistor coupled between a voltage supply and the inverter;

an input resistor coupled to the drain of the input stage, wherein the input resistor limits a current when the input signal comprises a signal generated from an electrostatic discharge;

a first clamping circuit coupled to the input resistor to clamp the input signal to the voltage supply;

a second clamping circuit coupled to the input resistor to clamp the input signal to ground;

a third clamping circuit coupled to the source of the input stage to clamp the input signal being presented at the source of the input stage to the voltage supply; and a fourth clamping circuit coupled to the source of the input stage to clamp the input signal being presented at the source of the input stage to ground.

19. An input buffer for a low-voltage flash memory device, comprising:

an input stage having a first connection, a second connection, and a third connection, wherein the first connection is receptive to an inhibiting signal, wherein the second connection is receptive to an input signal, wherein the input stage inhibits the input signal from being presented at the third connection when the inhibiting signal is at a predetermined level;

an output stage having a first connection and a second connection, wherein the first connection is coupled to the third connection of the input stage, and wherein the second connection presents the input signal to the low-voltage flash memory device;

a resistor coupled to the second connection of the input stage, wherein the resistor limits a current when the input signal comprises a signal generated from an electrostatic discharge; and a first clamping circuit coupled to the third connection of the input stage to clamp the input signal being presented at the third connection of the input stage to ground, wherein the first clamping circuit enhances a charge-device-model test that is applied to the low-voltage memory device.

20. The input buffer of claim 19 wherein:

the input stage comprises an n-channel transistor;

the first connection of the input stage comprises a gate of the n-channel transistor;

the second connection of the input stage comprises a source of the n-channel transistor;

the third connection of the input stage comprises a drain of the n-channel transistor;

the output stage comprises an inverter comprising a p-channel transistor coupled in series with an n-channel transistor;

the first connection of the output stage comprises a gate of the p-channel transistor in the inverter coupled to a gate of the n-channel transistor in the inverter;

the second connection of the output stage comprises a drain of the n-channel transistor in the inverter coupled to a drain of the p-channel transistor in the inverter; and further comprising:

an enabling transistor coupled between a voltage supply and the inverter;

a pair of p-channel transistors coupled in series between the voltage supply and the third connection of the input stage, gates of each of the pair of p-channel transistors being receptive to the inhibiting signal;

a second clamping circuit coupled to the resistor to clamp the input signal to the voltage supply;

a third clamping circuit coupled to the resistor to clamp the input signal to ground; and a fourth clamping circuit coupled to the third connection of the input stage to clamp the input signal being presented at the third connection of the input stage to the voltage supply.

21. An input buffer for a low-voltage flash memory device, comprising:

an input stage having a gate, a drain, and a source, wherein the gate is receptive to an inhibiting signal, wherein the drain is receptive to an input signal, wherein the input stage inhibits the input signal from being presented at the source when the inhibiting signal is at a predetermined level;

an output stage having an inverter that includes a first connection and a second connection, wherein the first connection is coupled to the source of the input stage, and wherein the second connection presents the input signal to the low-voltage flash memory device;

wherein the inverter includes an n-channel transistor having a gate, a drain, and a source, wherein the gate is coupled to the source of the input stage, wherein the source is coupled to ground, and wherein the drain presents an inverted input signal;

wherein the inverter further includes a p-channel transistor having a gate, a drain, and a source, wherein the gate is coupled to the source of the input stage, wherein the source is coupled to the drain of the n-channel transistor; and further comprising an enabling transistor having a gate, a drain, and a source, wherein the gate is receptive to an enabling signal, wherein the drain is coupled to a voltage supply, wherein the source is coupled to the drain of the p-channel transistor.

22. The input buffer of claim 21, wherein the enabling transistor includes a p-channel transistor.

23. The input buffer of claim 21 wherein:

the input stage comprises an n-channel transistor; and further comprising:

a pair of p-channel transistors coupled in series between the voltage supply and the source of the input stage, gates of each of the pair of p-channel transistors being receptive to the inhibiting signal;

an input resistor coupled to the drain of the input stage, wherein the input resistor limits a current when the input signal comprises a signal generated from an electrostatic discharge;

a first clamping circuit coupled to the input resistor to clamp the input signal to the voltage supply;

a second clamping circuit coupled to the input resistor to clamp the input signal to ground;

a third clamping circuit coupled to the source of the input stage to clamp the input signal being presented at the source of the input stage to the voltage supply; and a fourth clamping circuit coupled to the source of the input stage to clamp the input signal being presented at the source of the input stage to ground.

24. An input buffer for a low-voltage flash memory device, comprising:

an input stage having a transistor that includes a gate, a drain, and a source, wherein the gate is receptive to an inhibiting signal, wherein the drain is receptive to an input signal, wherein the transistor inhibits the input signal from being presented at the source when the inhibiting signal is at a first predetermined level;

an output stage having an inverter that includes a first connection and a second connection, wherein the first connection is coupled to the source of the transistor, and wherein the second connection presents the input signal to the low-voltage flash memory device; and a voltage sensor to trigger when the input signal is at a second predetermined level, wherein the voltage sensor is receptive to a pumped signal and the input signal.

25. The input buffer of claim 24, wherein the voltage sensor includes a triggering stage receptive to the input signal, wherein the triggering stage includes a first portion that has a set of p-channel transistors that includes:

a first p-channel transistor having a gate, a drain, a source, and a bias, wherein the gate is coupled to a first resistor, wherein the bias is coupled to the input signal, wherein the first resistor is coupled to a voltage supply;

a second p-channel transistor having a gate, a drain, a source, and a bias, wherein the gate is coupled to a second resistor, wherein the drain is coupled to the second resistor and the source of the first p-channel transistor, wherein the bias is coupled to the input signal;

a third p-channel transistor having a gate, a drain, a source, and a bias, wherein the gate is coupled to a third resistor, wherein the source is coupled to the input signal, wherein the drain is coupled to the third resistor and the source of the second p-channel transistor, and wherein the bias is coupled to the input signal; and wherein the triggering stage includes a second portion that has a set of n-channel transistors that includes:

a first n-channel transistor having a gate, a drain, and a source, wherein the gate is coupled to the pumped signal, wherein the source is coupled to ground;

a second n-channel transistor having a gate, a drain, and a source, wherein the gate is coupled to the pumped signal, wherein the source is coupled to the drain of the first n-channel transistor;

a third n-channel transistor having a gate, a drain, and a source, wherein the gate is coupled to the pumped signal, wherein the source is coupled to the drain of the second n-channel transistor;

a fourth n-channel transistor having a gate, a drain, and a source, wherein the gate is coupled to the pumped signal, wherein the source is coupled to the drain of the third n-channel transistor;

a fifth n-channel transistor having a gate, a drain, and a source, wherein the gate is coupled to the pumped signal, wherein the source is coupled to the drain of the fourth n-channel transistor; and a sixth n-channel transistor having a gate, a drain, and a source, wherein the gate is coupled to the pumped signal, wherein the drain is coupled to the source of the first p-channel transistor, and wherein the source is coupled to the drain of the fifth n-channel transistor.

26. The input buffer of claim 25, further comprising a set of metal options that includes:

a first metal option having a first connection and a second connection, wherein the first connection is receptive to the input signal, and wherein the second connection is coupled to the source of the third p-channel transistor;

a second metal option having a first connection and a second connection, wherein the first connection is coupled to the source of the third p-channel transistor, and wherein the second connection is coupled to the drain of the third p-channel transistor;

a third metal option having a first connection and a second connection, wherein the first connection is coupled to the source of the second p-channel transistor, and wherein the second connection is coupled to the drain of the second p-channel transistor;

a fourth metal option having a first connection and a second connection, wherein the first connection is coupled to the drain of the fifth n-channel transistor, and wherein the second connection is coupled to the source of the fifth n-channel transistor;

a fifth metal option having a first connection and a second connection, wherein the first connection is coupled to the drain of the fourth n-channel transistor, and wherein the second connection is coupled to the source of the fourth n-channel transistor;

a sixth metal option having a first connection and a second connection, wherein the first connection is coupled to the drain of the third n-channel transistor, and wherein the second connection is coupled to the source of the third n-channel transistor;

a seventh metal option having a first connection and a second connection, wherein the first connection is coupled to the drain of the second n-channel transistor, and wherein the second connection is coupled to the source of the second n-channel transistor; and an eighth metal option having a first connection and a second connection, wherein the first connection is coupled to the drain of the first n-channel transistor, and wherein the second connection is coupled to the source of the first n-channel transistor.

27. The input buffer of claim 25, further comprising an inverting stage that includes:

a first inverting stage that includes:
a first inverter that includes:
a seventh n-channel transistor having a gate, a drain, and a source, wherein the gate is coupled to the drain of the sixth n-channel transistor, wherein the source is coupled to ground;
a fourth p-channel transistor having a gate, a drain, a source, and a bias, wherein the gate is coupled to the gate of the seventh n-channel transistor, wherein the source is coupled to the voltage supply, wherein the drain is coupled to the drain of the seventh n-channel transistor, and wherein the bias is coupled to the voltage supply;
a second inverter that includes:
an eighth n-channel transistor having a gate, a drain, and a source, wherein the gate is coupled to the drain of the seventh n-channel transistor, wherein the source is coupled to ground;

a fifth p-channel transistor having a gate, a drain, a source, and a bias, wherein the gate is coupled to the gate of the eighth n-channel transistor, wherein the source is coupled to the voltage supply, wherein the drain is coupled to the drain of the eighth n-channel transistor, and wherein the bias is coupled to the voltage supply;

a second inverting stage that includes:

a third inverter having a first connection and a second connection, wherein the first connection is coupled to the drain of the eighth n-channel transistor; and a fourth inverter having a first connection and a second connection, wherein the first connection is coupled to the second connection of the third inverter.

28. The input buffer of claim 27, further comprising a delay stage to reject undesired noise that includes:

a first delay circuit that includes:

a first metal option having a first connection and a second connection, wherein the first connection is coupled to the drain of the eighth n-channel transistor;

a second metal option having a first connection and a second connection, wherein the first connection is coupled to the voltage supply, wherein the second connection is coupled to the second connection of the first metal option;

a sixth p-channel transistor having a gate, a drain, and a source, wherein the gate is coupled to the second connection of the first metal option, wherein the drain is coupled to the source, wherein the source is coupled to the voltage supply;

a second delay circuit that includes:

a third metal option having a first connection and a second connection, wherein the first connection is coupled to the drain of the eighth n-channel transistor;

a fourth metal option having a first connection and a second connection, wherein the first connection is coupled to ground, wherein the second connection is coupled to the second connection of the third metal option;

a ninth n-channel transistor having a gate, a drain, and a source, wherein the gate is coupled to the second connection of the third metal option, wherein the drain is coupled to the source, wherein the source is coupled to ground;

a third delay circuit that includes:

a fifth metal option having a first connection and a second connection, wherein the first connection is coupled to the drain of the eighth n-channel transistor;

a sixth metal option having a first connection and a second connection, wherein the first connection is coupled to the voltage supply, wherein the second connection is coupled to the second connection of the fifth metal option;

a seventh p-channel transistor having a gate, a drain, and a source, wherein the gate is coupled to the second connection of the fifth metal option, wherein the drain is coupled to the source, wherein the source is coupled to the voltage supply;

a fourth delay circuit that includes:

a seventh metal option having a first connection and a second connection, wherein the first connection is coupled to the drain of the eighth n-channel transistor;

an eighth metal option having a first connection and a second connection, wherein the first connection is coupled to ground, wherein the second connection is coupled to the second connection of the seventh metal option; and a tenth n-channel transistor having a gate, a drain, and a source, wherein the gate is coupled to the second connection of the seventh metal option, wherein the drain is coupled to the source, wherein the source is coupled to ground.

29. An input buffer for a low-voltage flash memory device, comprising:

an input stage having a transistor that includes a gate, a drain, and a source, wherein the gate is receptive to an inhibiting signal, wherein the drain is receptive to an input signal, wherein the transistor inhibits the input signal from being presented at the source when the inhibiting signal is at a first predetermined level;

an output stage having an inverter that includes a first connection and a second connection, wherein the first connection is coupled to the source of the transistor, and wherein the second connection presents the input signal to the low-voltage flash memory device; and an inhibiting circuit to selectively produce the inhibiting signal, wherein the inhibiting circuit is receptive to a pumped signal and a sensed signal.

30. The input buffer of claim 29, wherein the inhibiting circuit includes a first n-channel transistor having a gate, a drain, and a source, wherein the gate is receptive to the sensed signal, wherein the drain presents the inhibiting signal, wherein the source is coupled to ground.

31. The input buffer of claim 30, wherein the inhibiting circuit includes a second n-channel transistor having a gate, a drain, and a source, wherein the gate is coupled to an inverted sensed signal, wherein the source is coupled to ground.

32. The input buffer of claim 29, wherein the inhibiting circuit includes a first p-channel transistor having a gate, a drain, a source, and a bias, wherein the gate is coupled to the drain of the second n-channel transistor, wherein the source is receptive to the pumped signal, wherein the drain is coupled to the drain of the first n-channel transistor, and wherein the bias is receptive to the pumped signal.

33. The input buffer of claim 32, wherein the inhibiting circuit includes a second p-channel transistor having a gate, a drain, a source, and a bias, wherein the gate is coupled to the drain of the first n-channel transistor, wherein the source is receptive to the pumped signal, wherein the drain is coupled to the drain of the second n-channel transistor, and wherein the bias is receptive to the pumped signal.

34. An input buffer for a low-voltage flash memory device, comprising:

an input stage having a first n-channel transistor that includes a gate, a drain, and a source, wherein the gate is receptive to an inhibiting signal, wherein the drain is receptive to an input signal, wherein the input stage inhibits the input signal from being presented at the source when the inhibiting signal is at a low level;

an output stage to present the input signal to the low-voltage flash memory device, wherein the output stage includes:

a second n-channel transistor having a gate, a drain, and a source, wherein the gate is coupled to the source of the first n-channel transistor, wherein the source is coupled to ground, and wherein the drain presents an inverted input signal;

a first p-channel transistor having a gate, a drain, and a source, wherein the gate is coupled to the source of the first n-channel transistor, and wherein the drain is coupled to the drain of the second n-channel transistor; and a second p-channel transistor having a gate, a drain, and a source, wherein the gate is receptive to an enabling signal, wherein the source is coupled to a voltage supply, wherein the drain is coupled to the source of the first p-channel transistor.

35. The input buffer of claim 34, further comprising:

a resistor coupled to the drain of the first n-channel transistor, wherein the resistor limits a current when the input signal comprises a signal generated from an electrostatic discharge;

a pair of p-channel transistors coupled in series between the voltage supply and the source of the first n-channel transistor, gates of each of the pair of p-channel transistors being receptive to the inhibiting signal;

a first clamping circuit coupled to the resistor to clamp the input signal to the voltage supply;

a second clamping circuit coupled to the resistor to clamp the input signal to ground;

a third clamping circuit coupled to the source of the first n-channel transistor to clamp the input signal being presented at the source of the first n-channel transistor to the voltage supply; and a fourth clamping circuit coupled to the source of the first n-channel transistor to clamp the input signal being presented at the source of the first n-channel transistor to ground.

36. An input buffer for a low-voltage flash memory device, comprising:

an input stage having a first n-channel transistor that includes a gate, a drain, and a source, wherein the gate is receptive to an inhibiting signal, wherein the drain is receptive to an input signal, wherein the input stage inhibits the input signal from being presented at the source when the inhibiting signal is at a low level;

an output stage to present the input signal to the low-voltage flash memory device, wherein the output stage includes:

a second n-channel transistor having a gate, a drain, and a source, wherein the gate is coupled to the source of the first n-channel transistor, wherein the source is coupled to ground, and wherein the drain presents an inverted input signal;

a first p-channel transistor having a gate, a drain, and a source, wherein the gate is coupled to the source of the first n-channel transistor, and wherein the drain is coupled to the drain of the second n-channel transistor; and a second p-channel transistor having a gate, a drain, and a source, wherein the gate is receptive to an enabling signal, wherein the source is coupled to a voltage supply, wherein the drain is coupled to the source of the first p-channel transistor;

a voltage sensor to trigger when the input signal is at a first high level, wherein the voltage sensor is receptive to a pumped signal and the input signal to produce a sensed signal; and an inhibiting circuit to selectively produce the inhibiting signal, wherein the inhibiting circuit is receptive to the pumped signal and the sensed signal.

37. The input buffer of claim 36, further comprising:

a resistor coupled to the drain of the first n-channel transistor, wherein the resistor limits a current when the input signal comprises a signal generated from an electrostatic discharge;

a pair of p-channel transistors coupled in series between the voltage supply and the source of the first n-channel transistor, gates of each of the pair of p-channel transistors being receptive to the inhibiting signal;

a first clamping circuit coupled to the resistor to clamp the input signal to the voltage supply;

a second clamping circuit coupled to the resistor to clamp the input signal to ground;

a third clamping circuit coupled to the source of the first n-channel transistor to clamp the input signal being presented at the source of the first n-channel transistor to the voltage supply;

a fourth clamping circuit coupled to the source of the first n-channel transistor to clamp the input signal being presented at the source of the first n-channel transistor to ground; and wherein:

the voltage sensor comprises a triggering stage receptive to the input signal and the pumped signal, a first inverting stage, a delay stage, and a second inverting stage coupled in series, the second inverting stage to produce the sensed signal; and the inhibiting circuit comprises a plurality of transistors coupled together and receptive to the sensed signal and the pumped signal to produce the inhibiting signal in response to the sensed signal and the pumped signal.

38. A method for buffering a low-voltage flash memory device, comprising:

transferring by an input stage having a gate, a drain, and a source, wherein the gate is receptive to an inhibiting signal, wherein the drain is receptive to an input signal, wherein the input stage inhibits the input signal from being presented at the source when the inhibiting signal is at a predetermined level;

outputting by an output stage by inverting by an inverter that includes a first connection and a second connection, wherein the first connection is coupled to the source of the input stage, and wherein the second connection presents the input signal to the low-voltage flash memory device;

wherein inverting includes the inverter that includes an n-channel transistor having a gate, a drain, and a source, wherein the gate is coupled to the source of the input stage, wherein the source is coupled to ground, and wherein the drain presents an inverted input signal;

wherein inverting includes the inverter that further includes a p-channel transistor having a gate, a drain, and a source, wherein the gate is coupled to the source of the input stage, wherein the drain is coupled to the drain of the n-channel transistor; and enabling the inverter by an enabling transistor having a gate, a drain, and a source, wherein the gate is receptive to an enabling signal, wherein the source is coupled to a voltage supply, wherein the drain is coupled to the drain of the p-channel transistor.

39. The method of claim 38, wherein enabling includes the enabling transistor that includes a p-channel transistor.

40. A method for buffering a low-voltage flash memory device, comprising:

transferring by an input stage having a first n-channel transistor that includes a gate, a drain, and a source, wherein the gate is receptive to an inhibiting signal, wherein the drain is receptive to an input signal, wherein transferring includes inhibiting the input signal from being presented at the source when the inhibiting signal is at a low level;

outputting by an output stage to present the input signal to the low-voltage flash memory device, wherein outputting includes:

receiving the input signal by a second n-channel transistor having a gate, a drain, and a source, wherein the gate is coupled to the source of the first n-channel transistor, wherein the source is coupled to ground, and wherein the drain presents the input signal at a low level when the gate receives the input signal at a high level;

receiving the input signal by a first p-channel transistor having a gate, a drain, and a source, wherein the gate is coupled to the source of the first n-channel transistor, and wherein the drain presents the input signal at a high level when the gate receives the input signal at a low level; and enabling the first p-channel transistor by a second p-channel transistor having a gate, a drain, and a source, wherein the gate is receptive to a low enabling signal, wherein the source is coupled to a voltage supply, wherein the drain is coupled to the source of the first p-channel transistor.

41. The method of claim 40, wherein the act of inhibiting occurs when the low-voltage flash memory device is inactivated.

42. A method for buffering a low-voltage flash memory device, comprising:

transferring by an input stage having a first n-channel transistor that includes a gate, a drain, and a source, wherein the gate is receptive to an inhibiting signal, wherein the drain is receptive to an input signal, wherein the input stage refrains from transferring the input signal from being presented at the source when the inhibiting signal is at a low level;

outputting by an output stage to present the input signal to the low-voltage flash memory device, wherein the output stage includes:

a second n-channel transistor having a gate, a drain, and a source, wherein the gate is coupled to the source of the first n-channel transistor, wherein the source is coupled to ground, and wherein the drain presents an inverted input signal;

a first p-channel transistor having a gate, a drain, and a source, wherein the gate is coupled to the source of the first n-channel transistor, and wherein the drain is coupled to the drain of the second n-channel transistor; and a second p-channel transistor having a gate, a drain, and a source, wherein the gate is receptive to an enabling signal, wherein the source is coupled to a voltage supply, wherein the drain is coupled to the source of the first p-channel transistor;

sensing by a voltage sensor to trigger when the input signal is at a first high level, wherein the voltage sensor is receptive to a pumped signal and the input signal to produce a sensed signal; and producing by an inhibiting circuit that selectively produces the inhibiting signal, wherein the inhibiting circuit is receptive to the pumped signal and the sensed signal.

43. The method of claim 42 wherein the input stage refrains from transferring the input signal when the low-voltage flash memory device is inactivated.

* * * * *

UNITED STATES PATENT AND TRADEMARK OFFICE
CERTIFICATE OF CORRECTION

PATENT NO.     : 6,628,142 B1
DATED          : September 30, 2003
INVENTOR(S)    : Marotta et al.

It is certified that error appears in the above-identified patent and that said Letters Patent is hereby corrected as shown below:

Column 9,
Line 33, delete "$V_{TR}$'S" and insert -- $V_{TR}$'s --, therefor.

Column 10,
Line 58, delete "i4" and insert -- in --, therefor.

Column 22,
Line 38, delete "claim 29" and insert --claim 31 --, therefor.

Signed and Sealed this

Twenty-fifth Day of May, 2004

JON W. DUDAS
*Acting Director of the United States Patent and Trademark Office*